(12) United States Patent
Dumas et al.

(10) Patent No.: US 11,758,695 B2
(45) Date of Patent: Sep. 12, 2023

(54) COOLING SYSTEM FOR A DATA CENTER THAT INCLUDES AN OFFSET COOLING TECHNOLOGY

(71) Applicant: Digital Porpoise, LLC, Austin, TX (US)

(72) Inventors: Steven William Dumas, Great Falls, VA (US); Jason Wilfred Clark, Milford, NH (US); Michael Streich, Chicago, IL (US)

(73) Assignee: Digital Porpoise, LLC, Austin, TX (US)

(*) Notice: Subject to any disclaimer, the term of this patent is extended or adjusted under 35 U.S.C. 154(b) by 116 days.

(21) Appl. No.: 17/456,288

(22) Filed: Nov. 23, 2021

(65) Prior Publication Data

US 2022/0167523 A1 May 26, 2022

Related U.S. Application Data

(60) Provisional application No. 63/118,293, filed on Nov. 25, 2020.

(51) Int. Cl.
*G06F 1/16* (2006.01)
*H05K 5/00* (2006.01)
(Continued)

(52) U.S. Cl.
CPC ......... *H05K 7/208* (2013.01); *H05K 7/20145* (2013.01); *H05K 7/20172* (2013.01); *H05K 7/20327* (2013.01); *H05K 7/20718* (2013.01)

(58) Field of Classification Search
CPC ............... H05K 7/208; H05K 7/20145; H05K 7/20172; H05K 7/20327; H05K 7/20718; H05K 7/20745
See application file for complete search history.

(56) References Cited

U.S. PATENT DOCUMENTS 6,034,873 A 3/2000 Stahl et al.
6,557,624 B1 5/2003 Stahl et al.
(Continued)

FOREIGN PATENT DOCUMENTS

| EP | 1579155 B1 | 6/2011 |
| EP | 3370491 | 2/2018 |
| WO | WO 2012/140466 | 10/2012 |

OTHER PUBLICATIONS

PCT Search Report and Written Opinion for Application No. PCT/US2021/072581, dated Mar. 14, 2022, 16 pages.

*Primary Examiner* — Anthony M Haughton
(74) *Attorney, Agent, or Firm* — Knobbe Martens Olson and Bear, LLP

(57) ABSTRACT

A data center cooling system, including a support structure having a lower portion and an upper portion, one or more fans supported by the support structure at a height that is equal to or greater than a height of the electronics cabinets, and a heat exchanger having one or more cooling coils supported at the upper portion of the support structure. In some embodiments, the cooling coils can be supported by the upper portion of the support structure so as to be above the top of and/or over one or more of the electronics cabinets. The fans can be configured to draw air from the one or two rows of electronics cabinets and to cause the air to be passed through the heat exchanger to cool the warmer air from the electronics cabinets.

22 Claims, 9 Drawing Sheets

(51) Int. Cl.
*H05K 7/00* (2006.01)
*H05K 7/20* (2006.01)

(56) References Cited

U.S. PATENT DOCUMENTS

| | | |
|---|---|---|
| 6,644,384 B2 | 11/2003 | Stahl |
| 6,886,353 B2 | 5/2005 | Patel et al. |
| 6,938,433 B2 | 9/2005 | Bash et al. |
| 8,174,829 B1 | 5/2012 | Rotheroe |
| 8,635,881 B2 | 1/2014 | Carlson et al. |
| 8,988,879 B2 | 3/2015 | Hamburgen et al. |
| 9,032,742 B2 | 5/2015 | Dunnavant |
| 9,091,496 B2 | 7/2015 | Imwalle et al. |
| 8,934,242 B2 | 11/2015 | Bean, Jr. et al. |
| 9,301,432 B2 | 3/2016 | Nelson et al. |
| 9,426,903 B1 * | 8/2016 | Morales ............. H05K 7/20745 |
| 9,723,759 B2 | 8/2017 | Heydari et al. |
| 9,814,161 B2 | 11/2017 | Kondo et al. |
| 9,930,811 B2 | 3/2018 | Noteboom et al. |
| 10,064,312 B1 * | 8/2018 | Ingram ............. H05K 7/20745 |
| 10,107,518 B2 * | 10/2018 | Bailey ..................... F24F 11/76 |
| 10,117,362 B2 | 10/2018 | Noteboom et al. |
| 10,212,858 B2 | 2/2019 | Noteboom et al. |
| 10,244,652 B1 | 3/2019 | Czamara et al. |
| 10,271,462 B1 | 4/2019 | Ross et al. |
| 10,356,968 B2 | 7/2019 | Roy |
| 10,448,539 B2 | 10/2019 | Keisling et al. |
| 10,492,338 B2 * | 11/2019 | Lee ....................... F24F 5/0035 |
| 10,531,597 B1 | 1/2020 | Eichelberg et al. |
| 10,712,031 B2 | 7/2020 | Carlson et al. |
| 10,716,236 B2 | 7/2020 | Malone et al. |
| 10,716,241 B2 | 7/2020 | Keisling et al. |
| 10,716,242 B2 | 7/2020 | Kam et al. |
| 2010/0307716 A1 | 12/2010 | Bean, Jr. |
| 2013/0269385 A1 * | 10/2013 | Takahashi .......... H05K 7/20745 |
| | | 165/104.14 |
| 2014/0170951 A1 * | 6/2014 | Ryu .................. H05K 7/20745 |
| | | 454/184 |
| 2015/0036293 A1 * | 2/2015 | Martini .............. H05K 7/20172 |
| | | 361/695 |
| 2015/0342094 A1 * | 11/2015 | Ross .................. H05K 7/20745 |
| | | 361/679.46 |
| 2015/0369500 A1 * | 12/2015 | Phillips .............. H05K 7/20745 |
| | | 454/367 |
| 2016/0037685 A1 | 2/2016 | Ross |
| 2016/0057892 A1 * | 2/2016 | Tabe .................. H05K 7/20745 |
| | | 361/679.46 |
| 2018/0066859 A1 | 3/2018 | Ross |
| 2019/0037728 A1 | 1/2019 | Roy |
| 2020/0107474 A1 * | 4/2020 | Schmidt ............. H05K 7/20745 |
| 2021/0368655 A1 * | 11/2021 | Gao .................. H05K 7/20836 |
| 2022/0192057 A1 * | 6/2022 | Todoroki .............. F24F 1/0018 |

* cited by examiner

COOLING SYSTEM FOR A DATA CENTER THAT INCLUDES AN OFFSET COOLING TECHNOLOGY

PRIORITY CLAIM AND INCORPORATION BY REFERENCE

The present application claims priority to U.S. Patent Application No. 63/118,293, filed on Nov. 25, 2020, titled COOLING SYSTEM FOR A DATA CENTER THAT INCLUDES AN OFFSET COOLING TECHNOLOGY, the contents of which are hereby incorporated by reference herein in their entirety as if fully set forth herein. The benefit of priority is claimed under the appropriate legal basis including, without limitation, under 35 U.S.C. § 119(e).

BACKGROUND OF THE DISCLOSURE

Field of the Disclosure

Embodiments of the present disclosure relate to cooling systems for data centers.

Background

Servers are typically placed in cabinets (also referred to herein as racks) in a data center. There are a variety of physical configurations for cabinets. A typical cabinet configuration includes mounting rails to which multiple units of equipment, such as server blades, are mounted and stacked vertically within the cabinet. Watt densities of cabinets can vary greatly from cabinet to cabinet. Additionally, cabinet layouts are typically confined to pre-determined rows and spacing to align with perimeter cooling systems and other constraints, such as wall and column locations.

A data center room (also referred to as a data hall) should be maintained at acceptable temperatures and humidity for reliable operation of the servers, which typically have cooling fans that draw air through the chassis for cooling. As used herein, a data hall can include Information Technology (IT) Equipment and Information Technology Equipment (ITE) cabinets.

The power consumption of a cabinet densely stacked with servers can be several thousand watts. As a result, server cabinets can produce very concentrated heat loads. The heat dissipated by the servers in the cabinets is exhausted to the data center room. The heat collectively generated by densely populated cabinets can have an adverse effect on the performance and reliability of the equipment in the cabinets, since they rely on the surrounding air for cooling. Accordingly, heating, ventilation, air conditioning (HVAC) systems are often an important part of the design of an efficient data center.

In a data center room, server cabinets are typically laid out in rows with alternating cold and hot aisles between them. All servers are typically installed into the racks to achieve a front-to-back airflow pattern that draws conditioned air in from the cold rows, located in front of the cabinet, and ejects heat out through the hot rows behind the cabinets. A raised floor room design is commonly used to accommodate an underfloor air distribution system, where cooled air is supplied through vents in the raised floor along the cold aisles. Some data center rooms also use non-raised floors, which suffer many of the same disadvantages as raised floor data center rooms. An important factor in efficient cooling of a data center is to manage the air flow and circulation inside a data center. Drop ceilings, false ceilings, or plenum ceilings are also sometimes used to manage airflow back to the perimeter cooling units. Further, close-coupled systems such as in-row cooling, rear door heat exchangers, and overhead ceiling units are also sometimes used to cool data centers. Such systems can interfere with the cabinet layouts and airflow direction in the data room, can be contrary to server air flow requirements, can sometimes require more units thereby increasing costs, can sometimes require many more connections and components thereby increasing costs, and can sometimes obstruct customer support equipment like busways and cable trays. Liquid cooling systems such as direct to chip and immersion cooling are sometimes used to cool equipment in the data centers. Such systems can sometimes be more invasive to customers equipment and add cost and risk.

SUMMARY OF SOME EXEMPLIFYING EMBODIMENTS

Disclosed herein are embodiments of an offset cooling system for cooling at least one row of electronics cabinets, that can include a support structure having a lower portion and an upper portion, the lower portion of the support structure being coupled with and configured to support the upper portion of the support structure, one or more fans supported by the support structure at a height that is equal to or greater than a height of the electronics cabinets, and a heat exchanger having one or more cooling coils supported at the upper portion of the support structure. In any embodiments disclosed herein, the offset cooling system can be used between two rows of electronics cabinets. This may be a typical arrangement. However, any embodiments of the offset cooling system disclosed herein can be used with a single row of cabinets. In some embodiments, blanking panels (in lieu of the second row of cabinets) can be used.

Any embodiments of the devices, systems, and methods disclosed herein can include, in additional embodiments, one or more of the following steps, features, components, and/or details, in any combination with any of the other steps, features, components, and/or details of any other embodiments disclosed herein: wherein the heat exchanger is supported by the upper portion of the support structure so as to be above a top of one or more of the electronics cabinets; wherein the fans are configured to draw air from the at least one row of electronics cabinets and to cause the air to be passed through the heat exchanger to cool the warmer air from the electronics cabinets; further including a transition duct extending from the lower portion of the support structure to the upper portion of the support structure; wherein an area of an upper portion of the transition duct is greater than an area of a lower portion of the transition duct, to permit a low static pressure heat exchanger to be used with standard electronics cabinets spacing; wherein heat exchanger is supported by the upper portion of the transition duct and/or the upper portion of the support structure; wherein the lower portion of the support structure is configured to be positioned in an aisle between the two rows of electronics cabinets; wherein the at least one row of electronics cabinets includes a plurality of servers; wherein the fans are located above an aisle between the two rows of electronics cabinets; wherein the heat exchanger is positioned above the one or more fans; wherein the heat exchanger includes a plurality of cooling coils; wherein the heat exchanger has a first manifold in fluid communication with a plurality of cooling coils and a second manifold in communication with the plurality of cooling coils; wherein the heat exchanger is configured to receive a cool supply of water from a facility water source and to expel the warm water that has passed through the one or more coils into a drain of the facility or back to the facility water source; wherein the heat exchanger is configured to receive a refrigerant liquid; including one or more pressure, velocity, flow direction, and/or temperature sensors configured to control the air flow and temperature of the cooling system; A system for a data center, including the offset cooling system of any one of the previous claims and a first row of electronics cabinets and/or a second row of electronics cabinets; wherein the support structure is supported by a floor surface; wherein the support structure is supported by a ceiling or an overhead structure so that the support structure does not extend to the floor surface; wherein the support structure is supported by a ceiling or an overhead structure so that the support structure is not supported by the IT equipment cabinets; wherein the offset cooling system is configured to generally only provide enough fan energy to compensate for the static pressure across the heat exchanger and to enable one or more fans within the IT Equipment to provide the balance of the fan energy required to move the warm exhaust air through the heat exchangers; wherein the IT Equipment fans operate in a state of near zero differential air pressure; wherein the heat exchanger has a large form factor to minimize static pressure drop; including one or more troughs, gutters, and/or other conduits, channels, or water collection components for collecting water from water leaks in the heat exchanger or otherwise; and/or wherein the offset cooling system is configured to be in a close-coupled configuration to allow a supply water temperature to be increased to maximize free cooling run hours.

Also disclosed herein are embodiments of a method of cooling a data center having one or more servers, including drawing air from one or more electronics cabinets through one or more fans positioned above the one or more servers, and advancing the air from the one or more servers through a heat exchanger positioned above the one or more fans to cool the air. Also disclosed herein are embodiments of a method of cooling a data center including one or more servers substantially as described herein and/or shown in the accompanying drawings. Also disclosed herein are embodiments of a data center cooling system substantially as described herein and/or shown in the accompanying drawings. Also disclosed herein are embodiments of an offset cooling system for cooling at least one row of electronics cabinets, the offset cooling system including one or more fans supported by a support structure and a heat exchanger having one or more cooling coils supported at an upper portion of the support structure and extending over a top of the electronics cabinets. The heat exchanger can have a cooling liquid therein such that the cooling liquid passes through the heat exchanger over a portion of the electronics cabinets.

Any embodiments of the devices, systems, and methods disclosed herein can include, in additional embodiments, one or more of the following steps, features, components, and/or details, in any combination with any of the other steps, features, components, and/or details of any other embodiments disclosed herein: wherein the fans can be configured to draw air from the at least one row of electronics cabinets and to blow the air through the heat exchanger to cool the warmer air from the electronics cabinets; wherein the offset cooling system includes a transition duct extending at an angle from a lower portion of the support structure to the upper portion of the support structure; wherein an area of an upper portion of the transition duct is greater than an area of a lower portion of the transition duct, to permit a low static pressure heat exchanger to be used with standard electronics cabinets spacing; wherein an area of an upper portion of the transition duct is greater than an area of a lower portion of the transition duct, to permit a heat exchanger having a static pressure of approximately 0.5 in. WC or less to be used with standard electronics cabinets spacing; wherein the heat exchanger extends more than one foot over the top of the electronics cabinets; wherein the transition duct has a gutter along a bottom portion of each side thereof that collect water that collects on the first or second sloping walls of the transition duct; wherein the transition duct is configured to provide a barrier that covers a top of a portion of the electronics cabinets and to prevent water that may leak from the heat exchangers from dripping on the electronics cabinets; and/or wherein the upper portion of the transition duct (and/or an opening in the transition duct at the upper portion thereof) is approximately 60% larger, or between 40% and 70% larger, or between approximately 40% and approximately 70% larger, than the lower portion of the transition duct (and/or an opening in the transition duct at the lower portion thereof).

DETAILED DESCRIPTION OF THE PREFERRED EMBODIMENTS

Figure 1A:
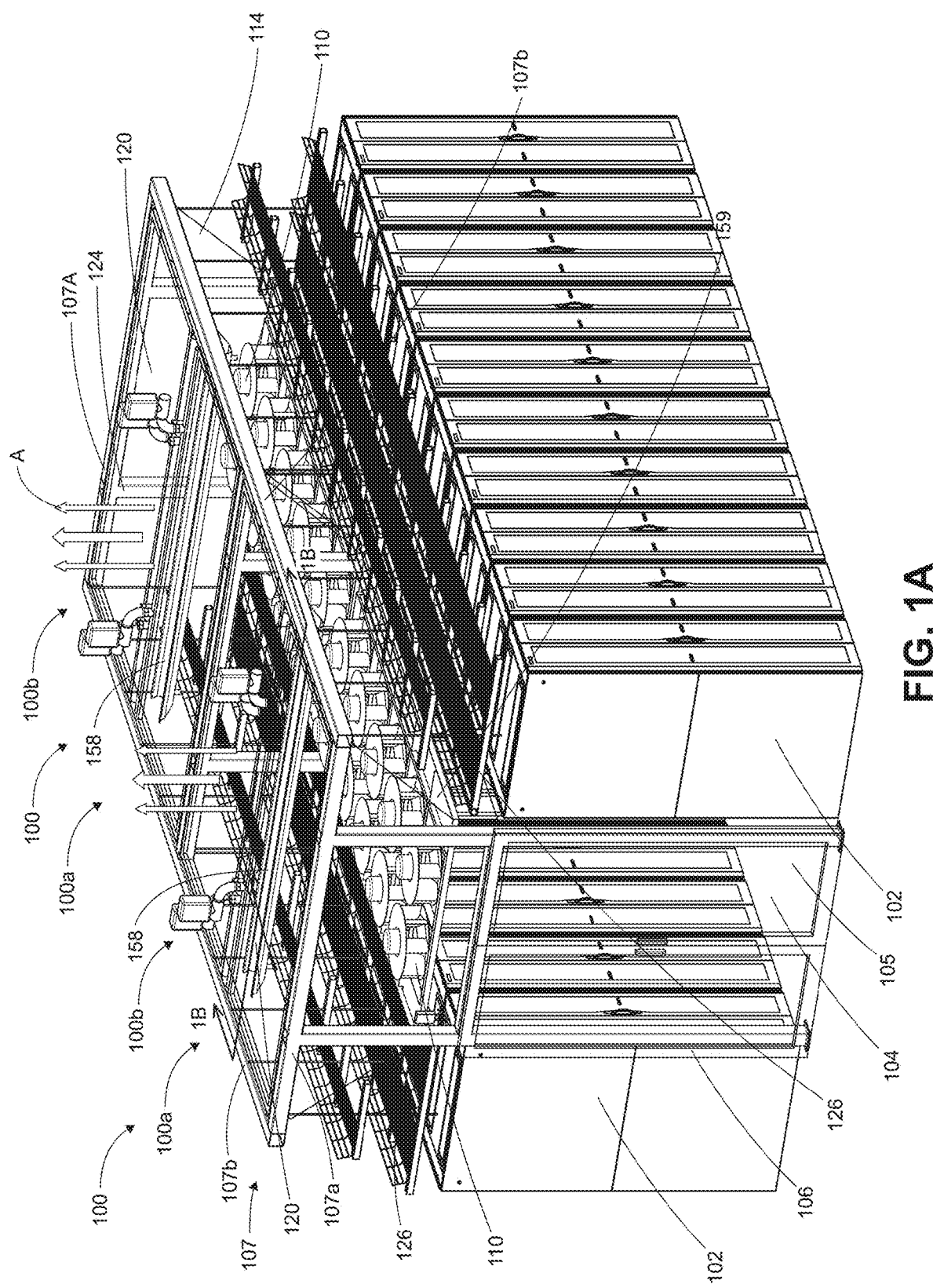
FIG. 1A is an orthogonal view showing one or more embodiments of an offset cooling system.

Some embodiments of the cooling systems for a data center disclosed herein can include an offset cooling technology that leverages server fan energy and integrates cooling into data center floor space. Some embodiments of the offset cooling system disclosed herein can alleviate and/or overcome constraints of traditional data center cooling technologies, partly due to the flexible watt density and independence from perimeter cooling and wall configurations of some embodiments of the cooling systems disclosed herein. Any embodiments of the offset cooling system 100 disclosed herein can be configured to work for cabinets or otherwise in data centers with and without raised floors and with and without dropped ceilings for air flow management. Further, some embodiments of the offset cooling system 100 disclosed herein can be less invasive to equipment in the data room, can be lower cost than other conventional cooling systems, and can reduce operating risks associated with such equipment. In any embodiments disclosed herein, the cabinets can be Information Technology Equipment (ITE) cabinets. IT Equipment can include servers, blade servers, and/or network equipment.

Conventional data center design methods place cooling units around the perimeter of the data center space. While required for providing open space for IT cabinets, an aspect of the present disclosure is the recognition that this method is inefficient from an airflow perspective. Cool air travels a considerable distance to get to the servers. Hot air expelled from the cabinets then travels an equal distance back to the cooling units. The distance traveled, resistance, and leakage along the way is the main reason for high fan energy costs. Additionally, close-coupled cooling technologies and row-based cooling products may have deficiencies based on impacts to customer's equipment layout and limited or contradictory airflow patterns and capacity issues. Conventional close-coupled cooling technologies also do not leverage server fan energy, leading to high fan energy costs, among other drawbacks. Further, fan energy is a large percentage of the overall cost to cool data centers, and space is valuable. In some embodiments, utilizing some embodiments of the offset cooling system disclosed herein allow reduced energy costs and better space utilization. Energy efficiency is a growing concern in data center design and fan energy is a sizable portion of the total energy consumed.

Embodiments of the offset cooling system 100 disclosed herein are configured to improve energy efficiency as well as being configured to minimize equipment manufacturing, installation, and operating costs. In some embodiments, this can be achieved by leveraging server fans installed in the data center and optimizing mechanical equipment parameters to reduce fan power consumption and to assist in circulating air. Servers and their integral fans are typically designed to operate in an open environment with no static pressure difference from inlet to exhaust. Some embodiments of the offset cooling system 100 disclosed herein are configured to allow the servers to operate as close as possible to that design condition and yet incorporate full containment to greatly increase energy efficiency. Other goals of at least some embodiments of the offset cooling system 100 disclosed herein include minimizing the internal equipment airflow resistance, positioning the fans, heat exchanger panels or elements having cooling coils and other equipment closer to the server heat loads (for example and without limitation, some embodiments of the offset cooling system 100 disclosed herein are configured to be suspended or positioned above the servers so as to not use valuable floor space), and/or utilizing the server fans to reduce the required fan power as much as possible. Another goal of at least some embodiments of the offset cooling system 100 disclosed herein include raising the temperature of the coils (also referred to herein as cooling coils) to allow additional hours of free cooling upstream of the offset cooling system. The use of close-coupled technology can reduce the amount of temperature rise between source and load, allowing for higher heat exchanger/coil temperature settings. An intent of at least some embodiments is to size the coil such that the unit has only minimal meaningful external static air pressure differential. The term free cooling, that can be relevant to some embodiments disclosed herein, is intended to refer to cooling without mechanical compressors being used. With free cooling, in some embodiments, energy savings can result from raising a coil inlet water temperature (which typically does raise the temperature of the coil). The higher the inlet chilled water temperature, the less energy required to produce the chilled water.

The energy savings can come in two forms. First, energy savings can result from additional hours of free cooling, wherein the chilled water in the free cooling mode can be cooled by outdoor equipment either directly through a dry cooler or indirectly through a heat exchanger in combination with a cooling tower. In both cases, the outdoor temperature can have a direct impact on the amount of heat removed from the chilled water. The colder the outdoor air, the more heat can be removed from the chilled water. The higher the chilled water temperature, the more free cooling can be used. Therefore, a higher chilled water temperature can allow more hours of free cooling. Secondly, raising the chilled water temperature reduces the "lift" on the chiller plant. The lift can be defined by the difference in temperature between the chilled water supply temperature and the condenser water return temperature. The condenser water can flow from the chiller to the cooling tower(s) located outside, release the heat, and then "return" back to the chiller. The condenser supply water temperature (as with free cooling) can be dependent on the outdoor air temperature. The lift on the chiller can also be reduced as the outdoor temperature decreases. An analogous energy savings can be achieved with Direct Expansion (DX) units (i.e., refrigerant-based heat exchangers instead of chilled water-based heat exchangers) using economizer cycles that take advantage of outdoor temperatures to reject heat.

The term close-coupled cooling technologies such as offset cooling is meant to refer to cooling systems that are positioned relatively close to the load (e.g., heat load from IT equipment, etc.), as opposed to perimeter CRAH/CRAH units where the air travels a great distance between the cooling source and the load. In some embodiments, the close proximity can reduce or eliminate or at least mitigate temperature rise of the supplied cool air prior to reaching the servers due to parasitic heat loads such as server cabinets, short-cycled air from server exhaust leaking into the cold aisle, and facility equipment such as transformers and switchgear. The temperature rise of the supplied cool air can, in some embodiments, require the chilled water temperature to be lowered to compensate for the parasitic heat loads. As discussed above, this can reduce the energy efficiency of the cooling plant.

Additionally, some embodiments include a close coupled cooling unit that is designed to occupy a minimal amount of floor space. In some embodiments, the offset cooling fans of the embodiments of the offset cooling system disclosed herein can be controlled to allow the IT Equipment fans to offset some of the fan energy required to move heat across the heat exchanger panel(s) or element(s). The IT Equipment fans are leveraged to push air across the cooling coils which are near the servers.

Some embodiments of the offset cooling system 100 disclosed herein can be configured to utilize a containment/support structure to hold a heat exchanger that can have a plurality of cooling coils above the hot aisle. In any embodiments disclosed herein, fans can be mounted below the heat exchanger and be configured to operably supplement the server fans in pushing air across the heat exchanger. In some embodiments, the offset cooling system can be configured to generally only provide enough fan energy to compensate for the static pressure across the heat exchanger and to enable one or more fans within the IT Equipment to provide the balance of the fan energy required to move the warm exhaust air through the heat exchangers allowing the IT Equipment to operate in a state of near zero differential pressure.

The fans of any embodiments of the offset cooling systems disclosed herein can be controlled individually, or the fans of a pod, or a group of fans can be controlled together or simultaneously. As used herein with some embodiments, a pod is meant to describe a group of more than one offset cooling system (e.g., a pod can be a group of two or more offset cooling systems, a group of three or more offset cooling systems, etc.). In any embodiments disclosed herein, the system can have a control system configured to control each of the fans individually, or control groups of fans, to account for outside pressure and/or to equalize air pressure from the electronics cabinets on a first side of the aisle with an air pressure from the electronics cabinets on a second, opposite side of the aisle and/or to equalize a pressure of the air imparted by the fans on the heat exchanger 120. In some embodiments, the offset cooling fans can be used (if controlled separately) to equalize the pressure from dissimilar servers to increase uniformity of airflow across the coils. In any embodiments disclosed herein, the system 100 and/or one or more fans 110 can each be configured to be hot swappable, to make it easy for service and repairs. For example and without limitation, the fans 110 can each be supported in a T bar type frame of the upper support section 107. In some embodiments, the system 100 and the fans 110 can be configured so that the fans 110 can be removed and replaced without the use of tools. For example, the one or more fans 110 can be configured to be removed by rotating and lifting the fans upwardly. In some embodiments, the fans 110 can be removed and replaced in a way that is similar to removing and replacing a ceiling tile.

For example and without limitation, a first set of one or more pressure sensors, temperature sensors, and/or other sensors (collectively referred to as the first set of sensors) can be used to determine the pressure, temperature, and/or other characteristics of the air from a first server cabinet or a first set of IT cabinets (also referred to herein as server cabinets or electronics cabinets) and a second set of one or more pressure sensors, temperature sensors, and/or other sensors (collectively referred to as the second set of sensors) can be used to determine the pressure, temperature, and/or other characteristics of the air from a second server cabinet or a second set of IT cabinets that can be adjacent to the first server cabinet or the first set of IT cabinets, across the aisle from the first server cabinet or the first set of IT cabinets, or otherwise. Any embodiments of the offset cooling system disclosed herein can have one or more of a first set of sensors proximal to or below the heat exchanger(s) and/or one or more of a second set of sensors distal to or downstream to or above the heat exchanger(s).

Additionally, in any embodiments disclosed herein, the offset cooling fans can be designed to supply any air that the server fans cannot natively provide via a differential pressure control or other airflow control system. The heat exchanger panels 120 and/or arrangement of coils 121 of any embodiments can be large in surface area, low in pressure drop, and can be ducted to the hot aisle.

FIG. 1A shows an embodiment of an offset cooling system 100 configured to cool one or more rows of IT (Information Technology) cabinets 102 (also referred to herein as electronics cabinets). With reference to FIG. 1A, some embodiments of the offset cooling system 100 can have a frame or other support structure 106 that can support the other components of the offset cooling system 100 above an aisle 104 between the cabinets 102. A door 105 (also referred to as a containment door) can be on both sides of the system 100. In some embodiments, the system 100 can have an upper support portion 107 (also referred to herein as an upper frame portion) that can have end frame members 107a and side frame members 107b that can be coupled with and/or supported by a lower portion of the support structure 106. A transition duct 114, as will be described in greater detail below, can be coupled with and supported by the upper support portion 107. In any embodiments disclosed herein, the support structure 106, the upper support portion 107, and/or any components thereof can be made from metal tubing material, including steel tubing material, that can be bolted, screwed, welded, and/or otherwise joined together. Airflow through the system 100 is represented by arrows A.

In some embodiments, the offset cooling system can have hangers, hooks, and/or other mounting hardware supported by or coupled with the upper support portion for supporting cables, one or more cable trays, fiber runners, power distribution, and/or other components or items above the electronics cabinets.

Figure 5:
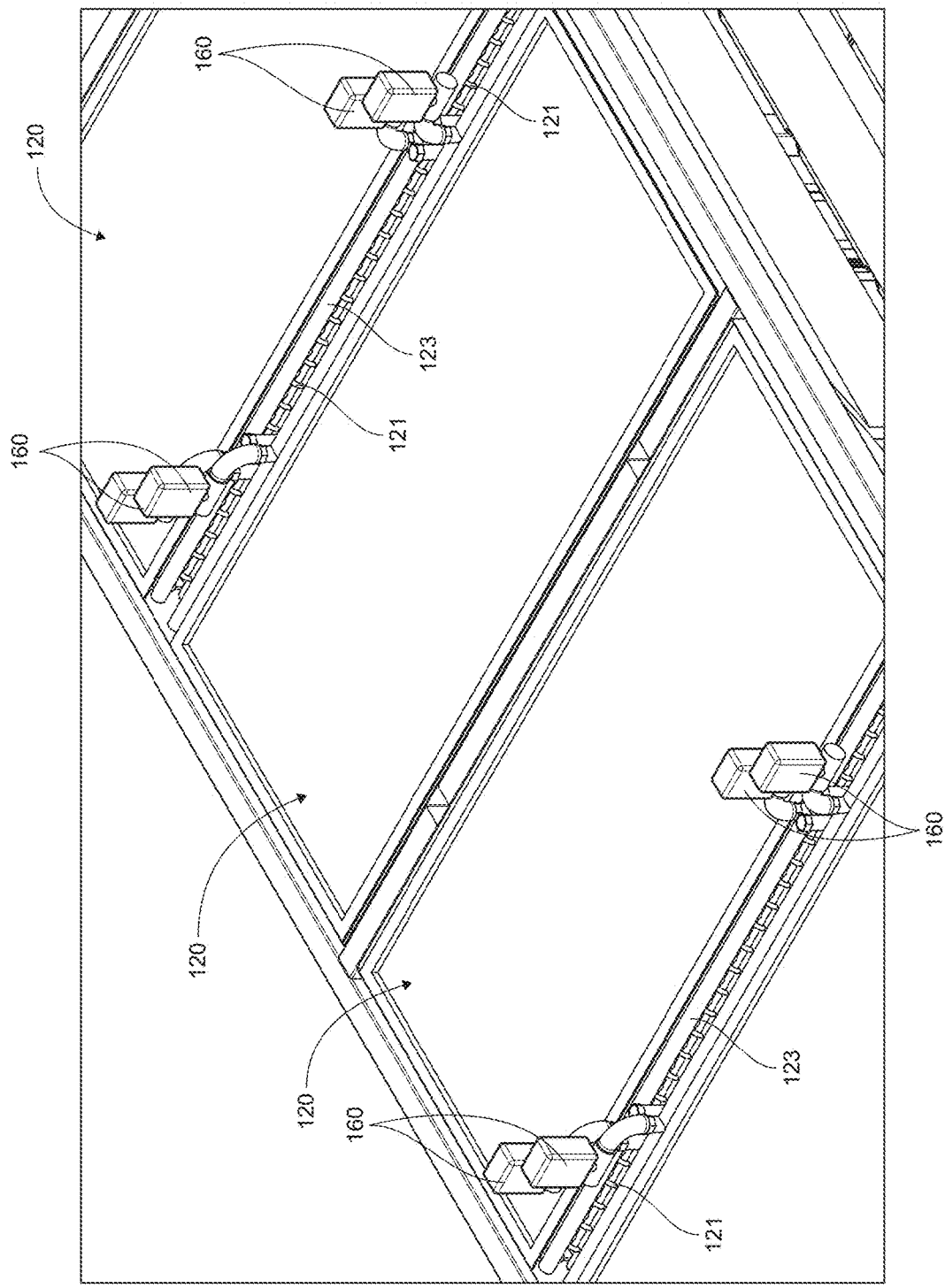
FIG. 5 is an enlarged view of a portion of the embodiment of the offset cooling systems shown in FIG. 1A.

The offset cooling system 100 can have one or more fans 110 supported by the support structure 106 above the aisle 104. A transition duct 114 can be used to direct the air flowing through the one or more fans 110 to the one or more heat exchangers 120 having a plurality of cooling coils 121 (see, e.g., FIG. 6) that can be supported at an upper end of the support structure 106. Note that the one or more heat exchangers 120 having a plurality of cooling coils 121 have been omitted from FIG. 1A for clarity. FIG. 5 shows an embodiment of a system 100 having a plurality of heat exchangers 120 each comprising a plurality of coils 121. Three heat exchangers 120 are shown in FIG. 5.

In some embodiments, the one or more fans 110 can draw the hot air away from the IT cabinets 102 and guide or push the hot air through the transition duct 114 and through the one or more heat exchangers 120 or the cooling coils 121 of the one or more heat exchangers 120. Thereafter, the cooled air 124 can pass into the open air above the offset cooling system 100 and/or then be available to repeat the cycle by reentering the server inlets.

Any of the embodiments of the offset cooling system 100 disclosed herein can have a controller or control module (not shown) that can be configured to compare the data or other information gathered from the first set of sensors with the data or other information gathered from the second set of sensors to determine the relative values and whether there is a difference between the first and second set of sensors. In some embodiments, the controller or control module can be configured to adjust a speed of one or more fans or one or more groups of fans within a pod or within adjacent pods to equalize or reduce pressure and or temperature differentials between the hot aisle and the cold aisle (before and after the heat exchanger). In some embodiments, though not required or in all embodiments, the controller or control module can be configured to increase a fan speed of a first fan or a first set of fans if the air pressure and/or air temperature of a first server cabinet or a first set of IT cabinets is the same as or, in some embodiments, greater than, a threshold value, as compared to the air pressure and/or air temperature of a second server cabinet or a second set of IT cabinets. The threshold value in some embodiments can be expressed as a percentage, such as 10%, or approximately 10%, or from 5% to 20%, or any values within the foregoing range.

In any embodiments, one or more of the fans or groups of fans can be controlled based on pre-set differential pressure thresholds and/or temperature thresholds. For example, in some embodiments, the controller or control module can be configured to increase a fan speed of a first fan or a first set of fans if the air pressure and/or air temperature above the heat exchanger is the same as or, in some embodiments, greater than, a threshold value, such as for example and without limitation, 75° F./24° C., or any other temperature or air pressure value that is suitable for the ITE in the data room. In some embodiments, the controller or control module can be configured to increase a fan speed of a first fan or a first set of fans if the differential pressure across the ITE cabinets is the same as or, in some embodiments, greater than, a threshold value, such as for example and without limitation, 0.004 in. WC (water column) or 1 Pa.

In this configuration, for example and without limitation, the controller or control module can be configured to increase a fan speed of a first fan or a first set of fans associated with a first server cabinet or a first set of IT cabinets if the air pressure and/or air temperature of a first server cabinet or a first set of IT cabinets is 10% or more than 10% greater than the air pressure and/or air temperature of a second server cabinet or a second set of IT cabinets, and/or can reduce the fan speed of a second set of fans associated with a second server cabinet or a second set of IT cabinets if the air pressure and/or air temperature of a first server cabinet or a first set of IT cabinets is 10% or more than 10% greater than the air pressure and/or air temperature of a second server cabinet or a second set of IT cabinets.

In some embodiments, the support structure 106 can be supported by a floor or ground surface, and/or can be secured to the floor or ground surface. Further, the support structure 106 and, consequently, the offset cooling system 100, can be free standing and can be supported either from the floor or hung from the ceiling/slab. Additionally, some embodiments can be configured to be joined together to form long aisles of cooling systems and accommodate long aisles of IT cabinets. Adjacent offset cooling systems within a pod can be spaced apart to accommodate lower cooling capacity designs. Conversely, IT Equipment loads can be separated to provide greater power density per ITE cabinet unit and system. Any embodiments of the offset cooling system 100 can be configured to work with rows of ITE cabinets that are arranged in single or double rows to form the center aisle. Further, empty spaces within the system can be sealed to form an aisle in the center of the system.

Figure 1B:
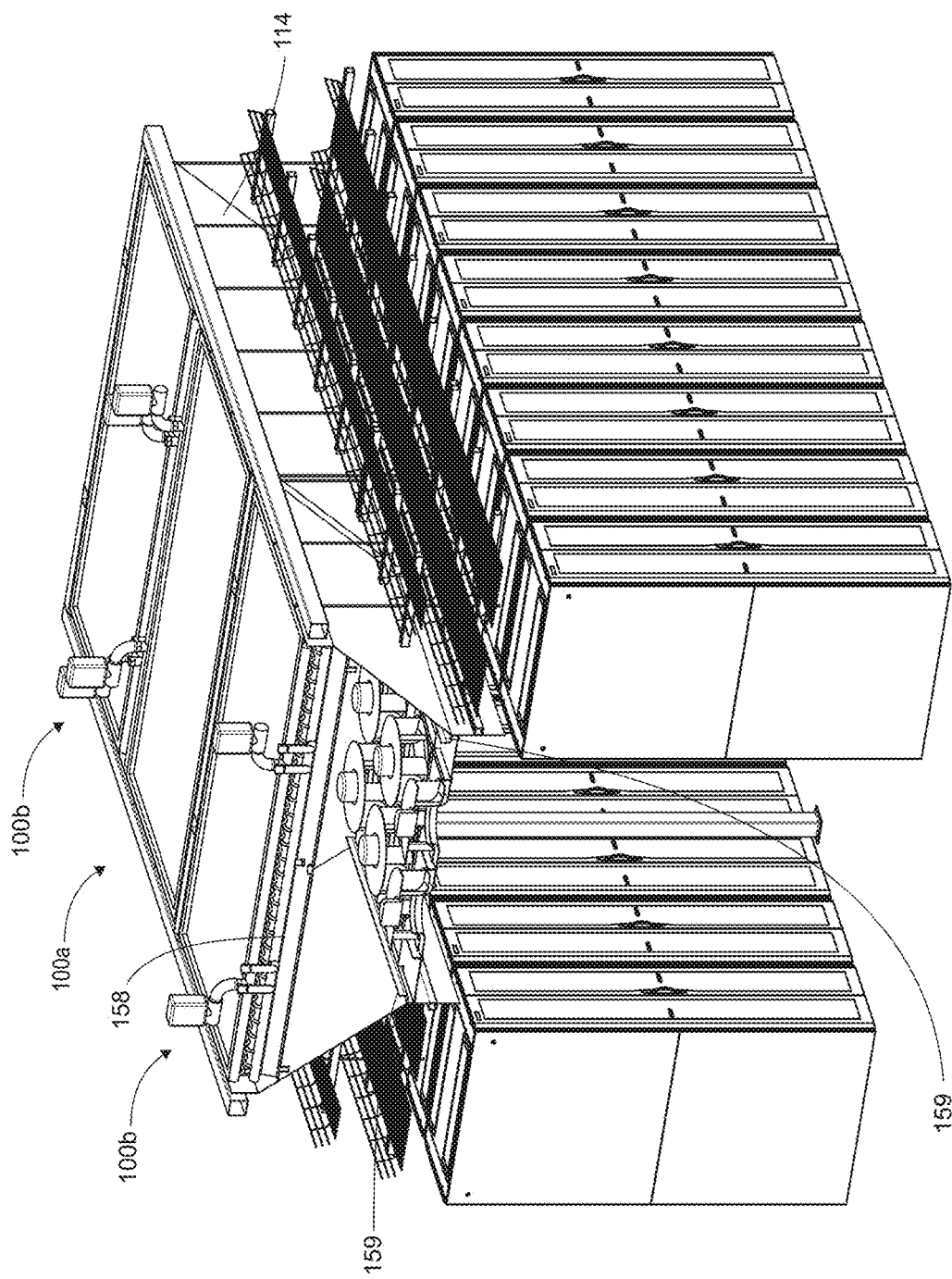
FIG. 1B is a section view of the embodiment of the one or more offset cooling systems shown in FIG. 1A, taken along line 1B-1B.

Any embodiments of the system disclosed herein can have a water collection system. In some embodiments, the transition duct 114 can be sealed against air and water, at least on the side portions thereof. Further, any embodiments of the offset cooling system 100 disclosed herein can have one or more troughs (e.g., troughs 158), gutters (e.g., gutters 159, as shown in FIG. 1B), and/or other conduits, channels, or water collection components for collecting water from water leaks (for example, in the heat exchangers), if any, and possibly condensation that, though unlikely in some embodiments, may occur, so as to prevent the servers and other electronics from exposure from the water. For example and without limitation, any embodiments of the offset cooling system 100 disclosed herein can have one or more troughs 158 that can be configured to collect condensation from the coils 121 and headers 123 (also referred to herein as manifolds) or other condensation or water that has collected on the heat exchanger 120. The one or more troughs 158 can be coupled with tubing, conduit, or other components to channel the water collected in the troughs to a drain or otherwise channel the liquid outside of the data room and/or away from the servers and other electronics. The troughs can, for example and without limitation, in some embodiments, channel water off the ends of the troughs onto a surface of the transition duct to channel water into the gutter and/or drain. In some embodiments, the coils and/or other components of the heat exchangers can have drains configured to permit a user to drain the liquid within the heat exchangers and/or coils into the troughs 158 or other components of the water drainage system.

As mentioned, some embodiments of the system 100 can be configured to channel any condensation, drips or leaks, and/or other water collected by the system 100 into a ground level or below ground level water collection system or channel that is configured to channel the condensation or water away from the data room without collecting on the floor and without exposure of the servers and other electronics to the water. In some embodiments, the data room can have floor tiles and/or ceiling tiles (e.g., in non-raised floor applications) that can have channels therein to provide a conduit for channeling any water collected by the system to a container or other receptacle, a drain or other location outside of the data room, or otherwise. In some embodiments, the coil or coils 121 of any of the heat exchangers 120 can be maintained at a temperature that is above the dew point to reduce the likelihood of any leaks or condensation forming on the coils 121 or other components or elements of the heat exchangers 120 (e.g., without limitation, heat transfer fins, ducting, etc.).

For example and without limitation, in some embodiments, a gutter or channel can be built into or supported by a bottom portion of the transition duct 114. The gutter or channel can be positioned just above fans 110 and/or at the bottom of the transition duct 114 to catch any condensation or water leaks, and can include leak detection and/or a drain to the floor level. For example and without limitation, one or more of the troughs or other components of the water management system, or all of the troughs and other components of the water management system can have sensors that can detect the presence of water in the troughs and/or other components of the water management system, and/or determine a level of the water in the troughs and/or other components of the water management system. The transition duct 114 can be configured to support a large, thin cooling coil and/or plurality of coils and can have a shape that allows existing data center accoutrement to work as industry standard, i.e., will not obstruct cable trays 126, cabinets, fiber trough, power busways, and other components or features.

In the embodiment of the offset cooling system 100 shown in FIG. 1A, each of the two offset cooling systems 100 shown has two sections 100a, 100b. Each of the sections can be the same or different. Therefore, FIG. 1A shows a pod having two offset cooling systems 100. In any embodiments, a data room can have a pod that has two or more, three or more, four or more, etc. offset cooling systems 100 arranged in one or more pods. In the illustrated embodiment, each of the offset cooling systems 100 can have ten fans 110. In other embodiments, each of the offset cooling systems 100 can have less than ten or more than ten fans 110, such as six fans 110, eight fans 110, twelve fans 110, or otherwise depending on the size and capacity of the fans 110, the energy efficiency of the fans 110, speed and noise of the fans 110, and other operating characteristics of the offset cooling system 100. In any embodiments disclosed herein, the fans can be radial (centrifugal) fans, axial fans, and/or induced, bladeless fans. Any of the fans can be ducted or not ducted. Additionally, any embodiments of the offset cooling system 100 disclosed herein can have a filtration system, or one or more filters positioned upstream of the fans 110. In some embodiments, the offset cooling system 100 can be configured such that the fans 110 can be changed while the offset cooling system 100 is in operation. The fans 110 of any embodiments can be configured to be reversible.

Some embodiments of the offset cooling system 100 can be configured to leverage natural convection of air, wherein hot, lofty air rises and cool dense air drops, further reducing fan energy requirements. Cool water (or another type of cooling fluid) can be provided to the coils 121 from a facility cool water supply. In some embodiments, the coils 121 of any of the heat exchangers 120 can be in a closed loop. A modulating valve can be used to supply cool water to the one or more coils 121 to control cooling at the heat exchanger 120 and to maintain a supply air temperature back to the data center space. In some embodiments, the servers can include fans (e.g., without limitation, server fans) that pull in air from the room, add heat, and expel the air into the hot aisle. Some embodiments of the system can be configured to use server fan energy to augment fan energy provided by the one or more fans 110. In this configuration, the pressure can be raised (or, raised slightly, such as, without limitation, by 0.002 in. WC or 0.5 Pa, or approximately 0.002 in. WC or approximately 0.5 Pa) by the server fans and air can be routed up into the fans 110 and the heat exchanger 120, eventually back to the space for the cycle to continue. This can provide a very short loop for air to travel at low pressure differentials saving fan energy.

In some embodiments, a controller or control module (which can be the same as or separate from/in addition to the controller or control module described above) can be used to control a flow of a fluid through the cooling coils 121 via the one or more valves 160, or otherwise of any embodiments of the system 100 disclosed herein. In some embodiments, for example and without limitation, the controls can include temperature sensors used as a reference to control the modulating valves on the coils and differential pressure sensors used as a reference to control the fan speeds (air flow). Some embodiments can include valves on the supply and return pipes to isolate the coil in the event that a leak is detected. Also, any embodiments of the heat exchanger disclosed herein can include one or more typical isolation valves.

Some embodiments of the offset cooling system 100 disclosed herein can shorten a cooling airflow path by up to 95% and can reduce the fan energy required to cool information technology ("IT") equipment by approximately 60% over traditional perimeter cooling systems and methods. Conventional cooling systems use approximately 40% of the total energy consumed by a data center to cool and move air. In the embodiments of the offset cooling system disclosed herein, heat can be removed closer to the source of the heat (i.e., the servers and other electronics) before any mixing of a cool supply air and a warm return airstream can occur. This can reduce the likelihood of one offset cooling system or pod affecting another, or some embodiments of the offset cooling system 100 or section of servers affecting another cooling system or section of servers.

In some embodiments, IT equipment power densities can be accommodated by applying more or fewer cooling units in an offset cooling system. In a conventional data center (also referred to as data rooms), cooling capacity is one for all and there is typically no means of dedicating cooling capacity to specific portions of the data center. Some embodiments of the offset cooling system 100 disclosed herein can be configured to allow specific portions of the data center to be individually controlled, such as individual rows of IT cabinets or IT equipment. In other words, some embodiments of the offset cooling system disclosed herein can be configured to permit individual row-based cooling and airflow control.

Additionally, some embodiments of the offset cooling system disclosed herein can reduce or eliminate impacts to a typical cabinet layout, such as by taking up floor space, as with conventional systems, and can virtually eliminate poor airflow configurations. Additionally, in some embodiments, offset cooling systems can be installed or integrated incrementally over time as the cooling load develops, thereby deferring the initial capital costs or potentially reducing the overall capital costs of a complete build.

In some embodiments, the offset cooling system can be modular to give operators and designers the ability to operate some components, or some offset cooling systems, or a pod, or multiple pods, on a stand-alone basis. This can allow deferment of offset cooling system installations until associated IT equipment is installed. In some embodiments, the offset cooling system 100 can be modular, meaning that the components of the offset cooling system 100 can be, but are not required to be, added where additional cooling is required. In some embodiments, the offset cooling system 100 can be minimalistic while featuring smart improvements to make sure the unit is serviceable and integrates other mechanical, electrical, and plumbing services into the installation. Further, some embodiments of the offset cooling system 100 can be configured to meet or exceed the operating characteristics of the baseline computer room air handling units (CRAH) while reducing the energy consumption of the equipment. Additionally, beyond reducing energy consumption, some of the embodiments of the offset cooling systems 100 disclosed herein can have higher watt density capacities as compared to conventional cooling systems, can have increased flexibility of equipment layouts and data hall configurations compared to conventional cooling systems, and can result in better airflow management as compared to conventional cooling systems.

With reference to the figures, some embodiments of the offset cooling system 100 can be located over a hot aisle, between rows or aisles of operating servers and/or installed IT cabinets. One or more fans (also referred to herein as a fan section) can be located in the bottom portion of the offset cooling system 100, which can facilitate service of the fan(s). In some embodiments, the fans can be positioned so as to not hang or extend over or significantly hang over the installed IT cabinets. In other embodiments, the one or more fan(s) can align or slightly overlap the installed IT cabinets for ease of containment installation.

Figure 4:
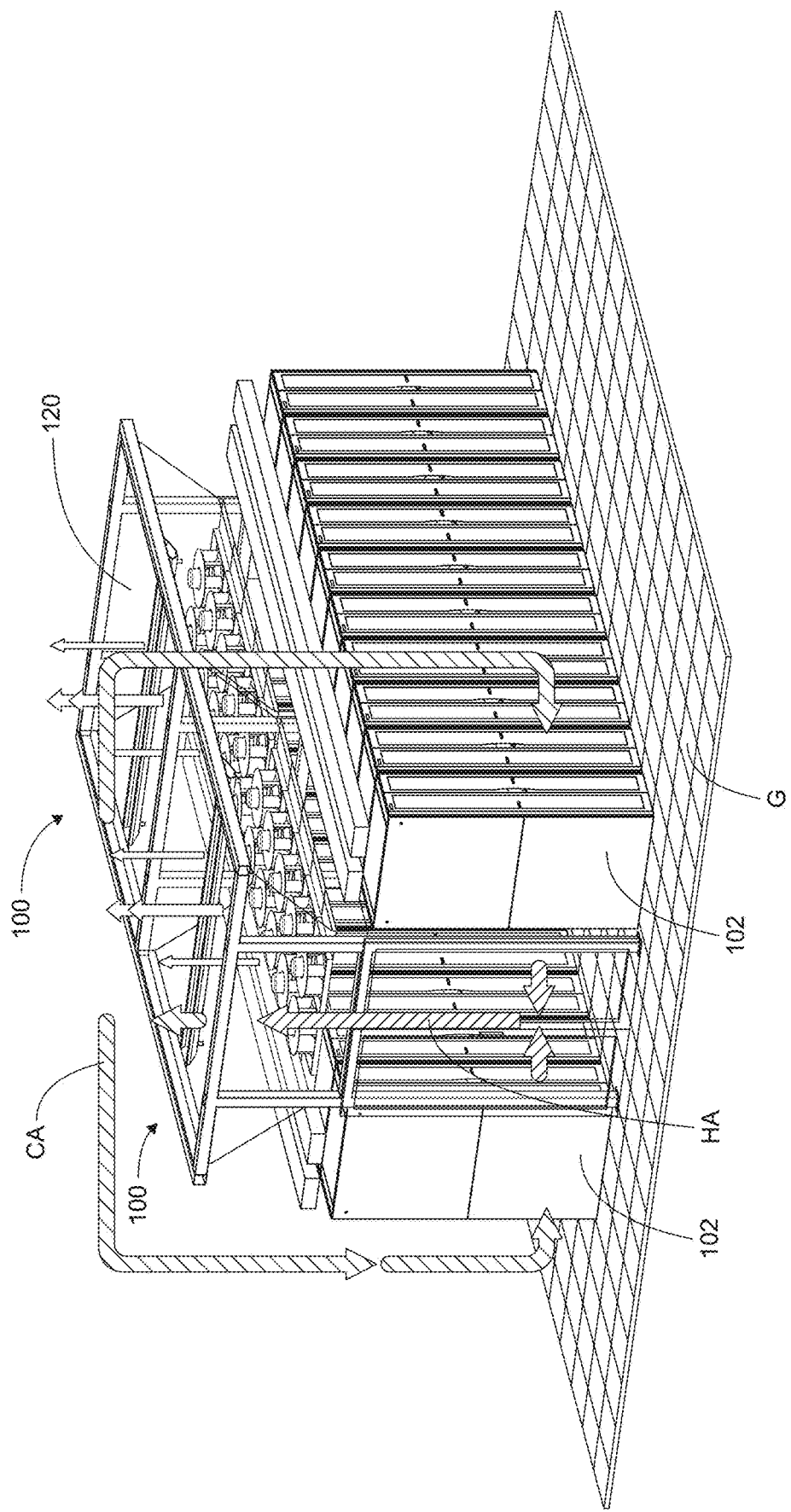
FIG. 4 is an orthogonal view of the embodiment of the offset cooling systems shown in FIG. 1A, showing an example of an airflow path for the offset cooling systems.

FIG. 4 is an orthogonal view of the embodiment of the offset cooling system 100, showing an example of an airflow path for the offset cooling system 100. As shown, in some embodiments, the system 100 can draw the hot air (represented by the arrows labeled with HA) from the servers and/or other electronics through the heat exchangers 120 (not shown for clarity). The hot air HA can be cooled by the heat exchangers 120 so that cool air (represented by the arrows labeled with CA) flows from the heat exchangers 120. The cool air CA can be circulated naturally by convection currents down the sides of the IT cabinets 102 (also referred to herein as server cabinets) and back through the IT cabinets 102 to draw heat from the electronics within the IT cabinets 102, thereby creating an airflow cycle to cool the electronics in the IT cabinets 102. The example embodiment shown in FIG. 4 has two offset cooling systems 100.

As noted above, some embodiments of the offset cooling system 100 can have a transition duct 114 (that can be made from sheet metal) downstream of the fans 110. The transition duct 114 can direct the airflow from the fan(s) 110 or fan section to a heat exchanger 120, which can include a cooling coil or a plurality of cooling coils. Note that the transition duct 114 in FIG. 1A has been made partially transparent in FIG. 1A to reveal other components of the system 100 shown in FIG. 1A.

In some embodiments, the heat exchangers 120 can have a large, nearly flat panel arrangement of cooling coils 121. The duct free area (i.e., the open space within the duct to slow airflow down), height, and transition angle of the transition duct can affect the velocity and uniformity of the air stream entering the heat exchanger 120. Initial iterations indicated that a 4'-0" tall transition duct 114 allowed for a good distribution of air across the heat exchanger 120. In some embodiments, the transition duct 114 can extend outwardly to allow for a greater surface area of the heat exchangers 120 and the plurality of coils 121 of the heat exchangers. For example and without limitation, the transition duct 114 of some embodiments can have a 75% (or approximately 75%) greater area at an upper section thereof where the heat exchanger 120 is supported as compared to a lower section of the transition duct 114 where the fans 110 are supported, or from 50% (or approximately 50%) to 100% (or approximately 100%, or greater than 100%), or any range in between these values, greater area at an upper section thereof where the heat exchanger 120 is supported as compared to a lower section of the transition duct 114 where the fans 110 are supported. In other embodiments, the transition duct 114 can have the same or approximately the same area on the upper section of the fan as compared to the lower section of the fan such that the transition duct 114 can have approximately vertical walls. As shown in FIG. 1A, the transition duct 114 can be defined by a pair of sloping walls that extend from the upper section to the lower section of the transition duct 114. In certain embodiments, the pair of sloping walls can be inclined at an angle of approximately 51°, or between 35° to 55°, or 35° to 75°].

In any embodiments disclosed herein, the heat exchanger coils can have a plurality of fins or other heat exchange components configured to increase a surface area of the heat exchanger coils. In some embodiments, the fins can be made from aluminum or other material with a high thermal conductivity.

In some embodiments, the heat exchanger 120 can be designed to minimize the amount of energy required to cool the IT equipment. For example and without limitation, some embodiments of the system 100 can have one or more heat exchangers 120 designed to have as low a static resistance to air flow as practical. In some embodiments, this can be achieved by making the heat exchanger 120 and/or the coils 121 of the heat exchanger 120 wide in the horizontal (or X and Y) directions, while minimizing the height (also referred to as depth) or profile (Z direction dimension) of the heat exchanger 120 and/or the coils 121 of the heat exchanger 120. Again, in some embodiments, the heat exchanger 120 and/or the plurality of coils 121 can have a low profile or otherwise be optimized to reduce a resistance/static pressure across the heat exchanger 120. In other words, the depth of the heat exchanger can be minimized to reduce the resistance/static pressure across the heat exchanger 120. This can, in some embodiments, improve the efficiency of the fans as they blow air across the heat exchanger 120 so that the fans 110 can be operated at a lower power. Additionally, some embodiments of the system 100 can have a transition duct 114 that increases in size from a lower portion of the transition duct 114, near the fans 110, to a larger overall area where the heat exchangers 120 are supported to thereby increase an overall surface area of the heat exchanger 120. In some embodiments, the upper portion of the transition duct (and/or an opening in the transition duct at the upper portion thereof) can be approximately 60% larger, or between 40% and 70% larger, or between approximately 40% and approximately 70% larger, than the lower portion of the transition duct (and/or an opening in the transition duct at the lower portion thereof). This can improve heat transfer efficiency, reduce the resistance/static pressure of air through the coils, reduce the energy consumption of the fans, and reduce the noise of the system by allowing the air to travel through the coils at a lower velocity. In some embodiments, the heat exchanger 120 can have a large form factor, which can reduce the static pressure across the heat exchanger 120.

In some embodiments, the offset cooling system 100 can have a plurality of fans wherein one, two, or more of the fans within one offset cooling system are redundant. However, some embodiments of the offset cooling system 100 can be configured such that there is no redundancy within one offset cooling system with regard to heat exchangers 120 and/or the cooling coils 121 of the heat exchangers 120. However, in some embodiments, the offset cooling system 100 can have redundancy at the single coil level. For example and without limitation, one pod (that can include more than one offset cooling system) can be configured so that there is redundancy within the pod in the form of complete offset cooling systems—i.e., if one offset cooling system 100 of a pod is lost, the other or another offset cooling system of the pod can be configured to partially or fully support the remaining cooling load in the pod. Or, in other embodiments, if one offset cooling system 100 of a pod is lost, two or more offset cooling systems 100 of the pod or of a combination of the same pod and of one or more adjacent pods can be configured to partially or fully support the remaining cooling load in the pod. This may be referred to as distributed redundancy.

In some embodiments, the system 100 can be configured so that the coils 121 of the heat exchangers are redundant, to compensate for the failure of some of the coils. For example and without limitation, the heat exchangers 120 can be configured to have a header 123 or two or more headers that can be configured to be in communication with all of the coils 121 in parallel—i.e., so that all of the coils 121 or, in some embodiments, a plurality of the coils 121 are arranged in parallel with one another. In this arrangement, a failure (e.g., a blockage) of one loop or coil 121 will not cause a failure (e.g., a blockage) of the other coils 121 of the heat exchanger 120. In some embodiments, each heat exchanger 120 can have a first header 123 and a second header 125 coupled with the coils 121 of the heat exchanger. In some embodiments, the supply header can be positioned below the coils of the heat exchanger and the return header can be positioned above the coils of the heat exchanger to facilitate filling and emptying of the coils and header of a closed loop heat exchanger. In some embodiments, a low point drain can be located in the lower header and can be accessible from inside the pod to facilitate filling and emptying of the coils and header.

Figure 6:
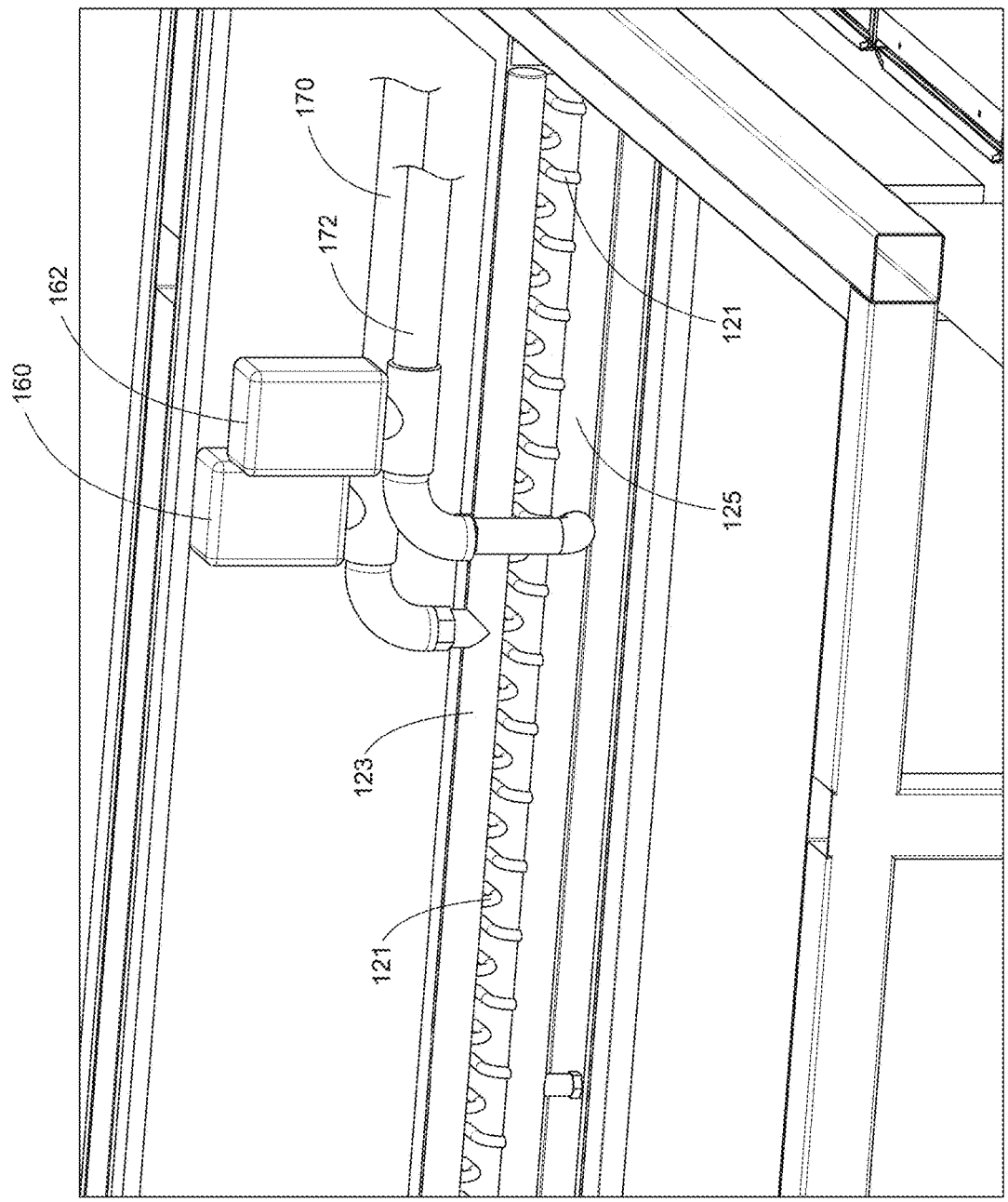
FIG. 6 is an enlarged view of a portion of the embodiment of the offset cooling systems shown in FIG. 1.

With reference to FIG. 6, in some embodiments, the second header 125 (which can be located below/upstream of the first header 123 in a typical operation) can be configured to provide a supply of a cooling liquid to the coils 121 and the first header 123 can be configured to collect the cooling liquid that has passed through the coils 121. This can result in the coils 121 from the second header 125 having the coolest liquid. A first valve 160 (which can be referred to as a modulating valve) can be used to control a flow of the cooling liquid into the second manifold 125. A second valve 162 (which can be referred to as a control valve) can be used to control a flow of the cooling liquid provided to the second manifold 125. Controlling a flow of the cooling liquid from the second manifold 125 can also, consequently, control a flow of the cooling liquid into the second manifold 123. A second pipe or conduit 172 can be in fluid communication with the second valve 162 and the second manifold 125 and can be configured to provide a passageway for a source of the cooling liquid to the second manifold 125. A first pipe or conduit 170 can be in fluid communication with the first valve 160 and the first manifold 123 and can be configured to provide a passageway for the cooling liquid to be removed from the first manifold 123. In some embodiments, cool fluid can be supplied via the second pipe 172 to a balancing valve (not shown) and to the header 125, through the coil 121 out to the first header 123, to the control valve 160, and be removed from the heat exchanger 120 at an elevated temperature via the first pipe 170.

In some embodiments, the heat exchanger 120 can be a closed loop system. In some embodiments, the heat exchanger 120 can be an open loop system that, as described above, wherein the cooling liquid is provided from an outside source. In some embodiments, without limitation, the cooling liquid in the open loop system can be facility water from the facility water supply.

In some embodiments of the offset cooling system 100, the offset cooling system 100 can be configured to facilitate removal and/or replacement of the one or more heat exchangers 120 and/or one or more of the coils 121. For example, one or more hooks, flanges, or other supports can be used to support a coil 121 or an array of coils 121, or a heat exchanger, permitting a user to lift the coils 121 or the heat exchanger upwardly to remove and, if needed, replace the heat exchanger or the coils.

In some embodiments, the coils 121 can be configured to facilitate removal of air from the coils 121. For example and without limitation, each heat exchanger 120 can have a manifold 123 configured to permit a distribution of the cooling fluid through the coils 121. In some embodiments, the header 123 can include valved ports that a user can use to bleed air from the cooling coils 121 to improve the efficiency of the system. Dedicated air bleed, auto air vent, or air eliminatory can be used to remove air from the system, including without limitation microbubbles that can be in the circulating liquid.

Traditionally, because of the possibility of water dripping on the servers and due to space constraints, it was not possible or feasible in many situations to position cooling equipment or structures above the servers. In some embodiments, because the system 100 includes water collection and management components, including one or more troughs, gutters, downspouts or other channels or tubes to move the water from the system to a drain or other duct and because the transition duct is smaller in a lower portion thereof, and/or for other reasons described herein, the system 100 or components of the system 100 can be positioned over the servers in the data room.

In some embodiments, the transition duct 114 can have a size of ten feet long (or approximately ten feet long), i.e., in a direction of a length of the aisle, by six feet wide (or approximately six feet wide), i.e., in a direction of a width of the aisle, at a lower section thereof, or from eight feet or less to twelve feet or more long by four feet or less to eight feet or more wide at a lower section thereof. Further, the transition duct 114 can have a size of ten feet long (or approximately ten feet long) by ten feet wide (or approximately ten feet wide) at an upper section thereof, or from eight feet or less to twelve feet or more long by eight feet or less to twelve feet or more wide at an upper section thereof. In any embodiments disclosed herein, the upper portion of the transition duct 114, the heat exchangers 120 (having the cooling coils), and/or the liquid in the heat exchangers 120 can be positioned over a portion of the IT Equipment cabinets (e.g., can extend at least one foot over the IT Equipment cabinets, or at least two feet over the IT Equipment cabinets, or In certain embodiments between one foot and two feet over the IT Equipment cabinets, or can in certain embodiments extend at least over 50% or over approximately 50% of the area of the IT Equipment cabinets, or can extend between from 25%-75% over the area of the IT Equipment cabinets, or between 25% to 100% or greater over the cabinets. As mentioned, the transition duct 114 and/or the gutter 159 can protect the IT Equipment cabinets from any water that can leak from the heat exchangers 120 positioned over the IT Equipment cabinets from dripping onto the IT Equipment cabinets. IT Equipment cabinets can be approximately four feet wide. In any embodiments disclosed herein, an upper portion of the transition duct and/or the heat exchangers can extend over the IT Equipment cabinets in a lateral direction of the transition ducts and/or the heat exchangers—e.g., in a direction that is perpendicular to the length of the aisle adjacent to or between the IT Equipment cabinets such that in certain embodiments the heat exchangers 120 (having the cooling coils), and/or the liquid in the heat exchangers 120 can be positioned over a portion of the IT Equipment cabinets (e.g., can extend in a lateral direction at least one foot over the IT Equipment cabinets, or at least two feet over the IT Equipment cabinets, or in certain embodiments between one foot and two feet over the IT Equipment cabinets.

In some embodiments, the one or more fans 110 can be electronically commutated (EC) or other single speed or variable speed fans, or combination thereof (e.g., any combination of EC fans, single speed fans, and/or variable speed fans), and can be configured for a capacity of approximately 26,805 CFM (cubic feet per minute), or approximately 21,450 CFM, or from 20,000 CFM to 30,000 CFM or more. In some embodiments, half of the fans of an offset cooling system 100 (e.g., five of the ten fans of an offset cooling system 100, or six of the twelve fans of an offset cooling system 100, or the majority of the fans of an offset cooling system 100 (e.g., six or seven of the ten fans of an offset cooling system 100, or seven, eight, or nine of the twelve fans of an offset cooling system 100) can be single speed fans and the remainder of the fans can be variable speed fans. In some embodiments, the one or more fans 110 can support a cooling load of from 150 kW (or approximately 150 kW) to 187.5 kW (or approximately 187.5 kW), or from 120 kW or less to 200 kW or more.

The cooling coils can be orientated and installed to minimize airside system effect/pressure drop. Attention to the fluid velocity through the coils is required to reduce and/or eliminate air that can be entrained in the coil. The cooling face velocity is an important parameter of the mechanical equipment and should be considered in the optimization of the offset cooling system 100.

In some embodiments, redundancy can be provided at the unit level as opposed to the individual component level. Some of the embodiments of the system 100 can include distributed redundancy where spare capacity from other offset cooling systems or other pods of offset cooling systems in the data hall can be used for spare capacity for other offset cooling systems or other pods of offset cooling systems in the same data hall. In some embodiments, the redundancy for a close coupled cooling system is different than a perimeter cooling system. Redundancy can be achieved at each hot aisle for some embodiments. Some embodiments of the offset cooling system 100 can have four units, or less than four units, or five units, or more than five units installed over a standardized deployment.

In any embodiments disclosed herein, the heat exchanger 120 can be designed or rated for a temperature drop of air going through the heat exchanger of 22.2° F. or approximately 22.2° F. (e.g., without limitation, an entering air temperature of 97.0° F. and a leaving air temperature of 74.8° F.), and an air pressure drop of 0.51 in. WC or approximately 0.51 in. WC, or from 0.4 in. WC to 0.6 in. WC, or from 0.45 in. WC to approximately 0.55 in. WC. In some embodiments, the heat exchanger 120 can be 6 rows of finned tubes in depth, with the fin spacing being 11 fins per inch, or approximately 11 fins per inch, or from 8-14 fins per inch. In any embodiments disclosed herein, the heat exchanger 120 can be designed or rated for a temperature increase of fluid going through the heat exchanger of 15° F. or approximately 15° F. (e.g., without limitation, an entering liquid temperature of 70° F. and a leaving liquid temperature of 85° F.).

Figure 2:
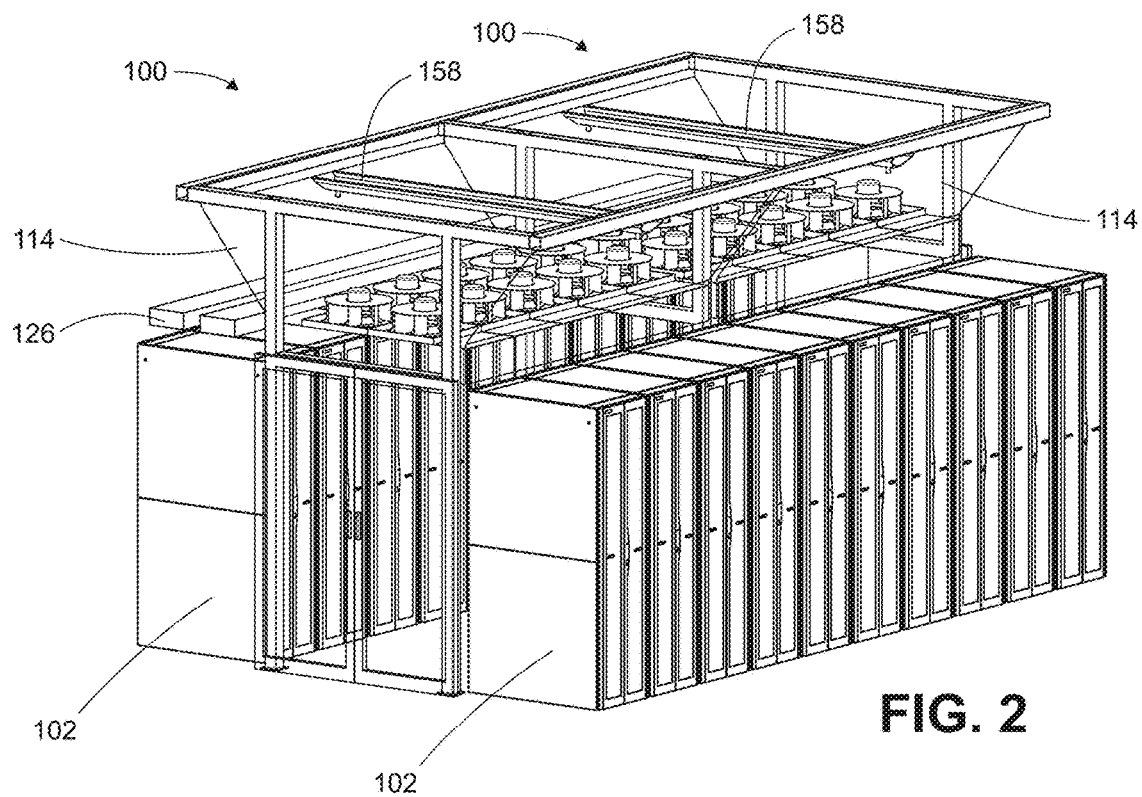
FIG. 2 is an orthogonal view of the embodiment of the offset cooling systems shown in FIG. 1A.
Figure 3:
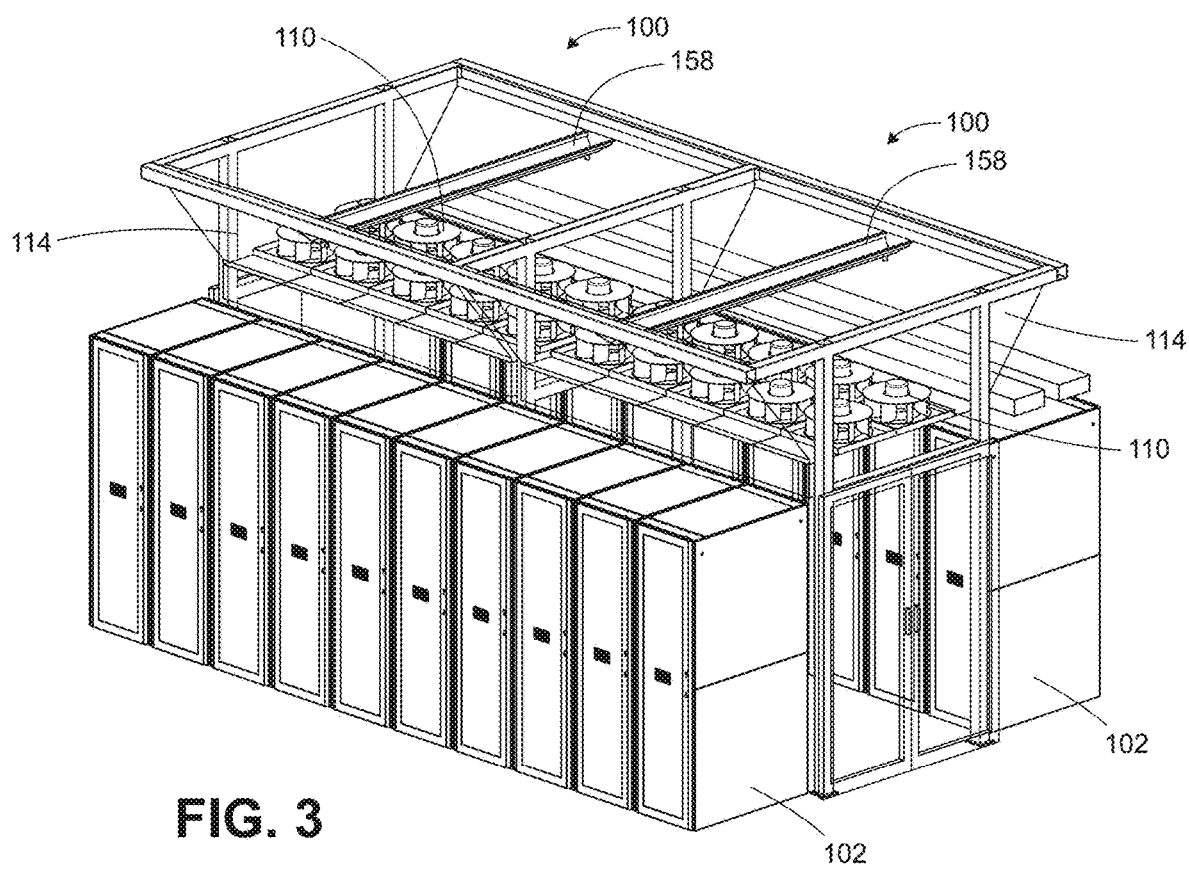
FIG. 3 is an orthogonal view of the embodiment of the offset cooling systems shown in FIG. 1A.

The development of the heat exchanger design affects the efficiency of the cooling concept. With reference to FIG. 2, some embodiments of the offset cooling system 100 can have two cooling coils per each 150 kW section (or per each approximately 150 kW section) of IT cabinets. In some embodiments, the cooling fluid passing through the cooling coils can be 100% water. In other embodiments, the cooling fluid can include other chemical or non-chemical refrigerants, liquids, other additives, and/or other heat carriers or heat carrying substances. In some embodiments, the cooling coil(s) 121 can be sized large to minimize pressure drop. The cooling coils can have a control valve in some embodiments. In other embodiments, the cooling coils can be operated without or be assembled without one or more control valves.

In some embodiments, the offset cooling system 100 and the cooling coils 121 can be configured for an approximately 20° F. airside temperature change, or an approximately 22° F. airside temperature change (for example and without limitation, from a 97° F. entering air temperature to a 75° F. leaving air temperature) or from a 20° F. (or approximately 20° F.) to a 25° F. (or approximately 25° F.) airside temperature change. The cooling coils 121 can be configured for an approximate maximum airflow rate of 26,805 CFM, a maximum face velocity of 500 FPM, a maximum airside pressure drop of 0.5" we (water column), for operating in and out water temperatures of 70° and 85°, respectively, and/or for a maximum waterside pressure drop of 12 ft. of head loss. In some embodiments, the cooling coils can be in a flat or horizontal orientation, or can be inclined (slightly or otherwise) and can be large so as to provide low pump power requirements for a liquid cooling loop. In some embodiments, an inclined orientation of the cooling coils can facilitate removal of air from cooling water. The inclination can create a high point for installing an air vent. Refrigerant coils can benefit from an incline as well. Some arrangements of refrigerant based, flooded evaporator systems may need an inclined coil to facilitate gas and liquid separation.

Additionally, some embodiments of the offset cooling system 100 can have one or more temperature, pressure, and/or smoke or fire detecting sensors, one or more lights, one or more fire suppression components, communications devices to transmit and receive data regarding the operation of the offset cooling system 100, and/or a control system configured to control the fans, cooling coil, and other components of the offset cooling system 100. In some embodiments, an opening or larger gap can be formed between some of the adjacent heat exchangers to allow for utilities (e.g., conduit, fire protection, controls, lighting effects, etc.) to enter a pod or an offset cooling system.

Some embodiments of the offset cooling system 100 can be configured to allow for ITE (Information Technology Equipment) to operate in its intended zero pressure difference or differential environment. Further, some embodiments can be configured to leverage ITE integral fans (e.g., server fans) to move air and contribute the majority or minority of air movement energy within the offset cooling system 100. Further, some embodiments of the offset cooling system 100 can be configured such that the offset cooling system 100 provides only enough fan energy to make up, or "offset" the static pressure drop of the cooling coil. Some embodiments of the offset cooling system 100 can be configured to fit in conventional hot or cold aisleways while minimizing airflow velocity at cooling coil. Additionally, high sensitivity, wide range, pressure controls can be utilized to maintain more precise fan control and improve energy efficiency.

Figure 7:
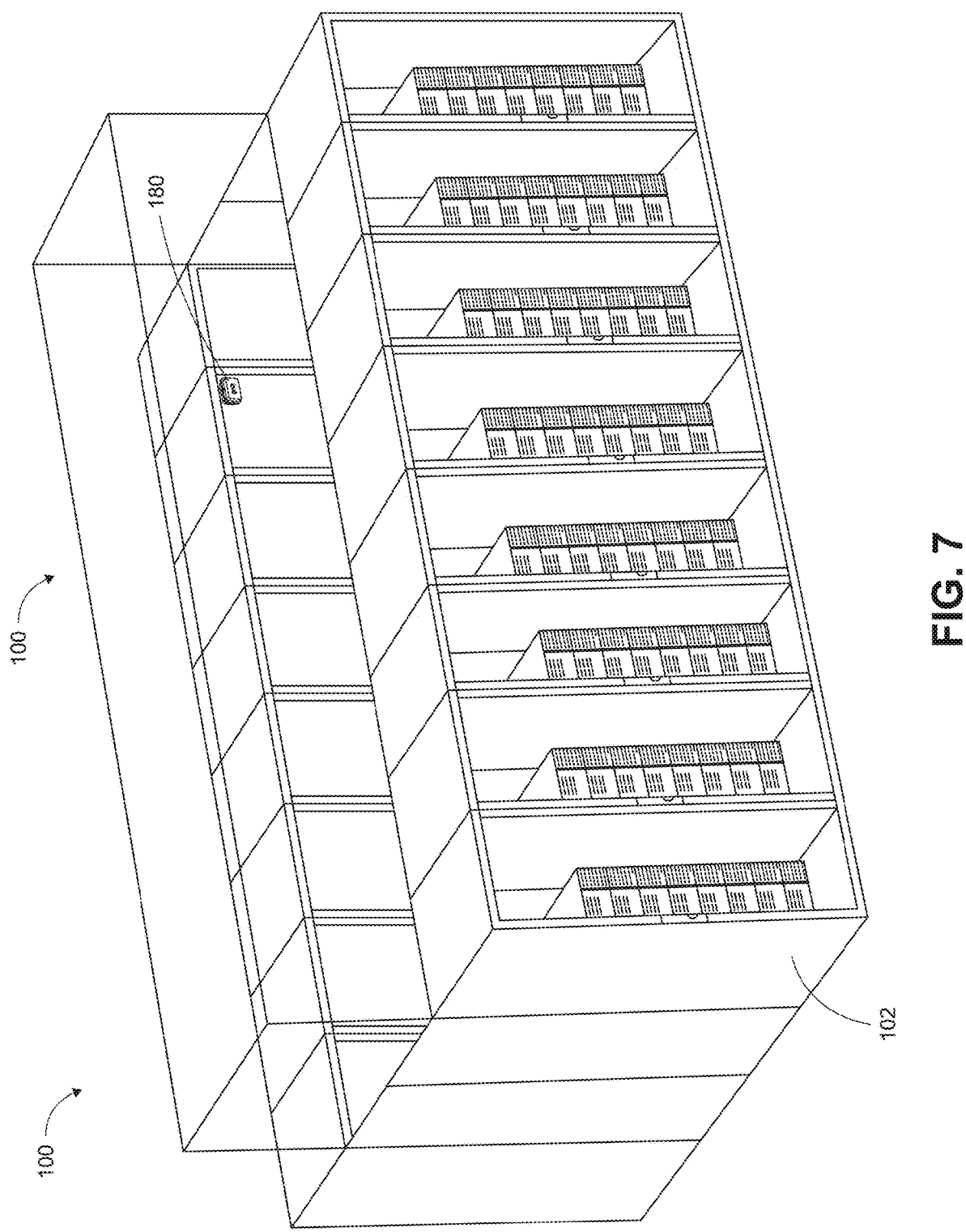
FIG. 7 is an orthogonal view of another embodiment of the offset cooling systems showing an embodiment of an airflow sensor in fluid communication with an airflow through the systems.
Figure 8:
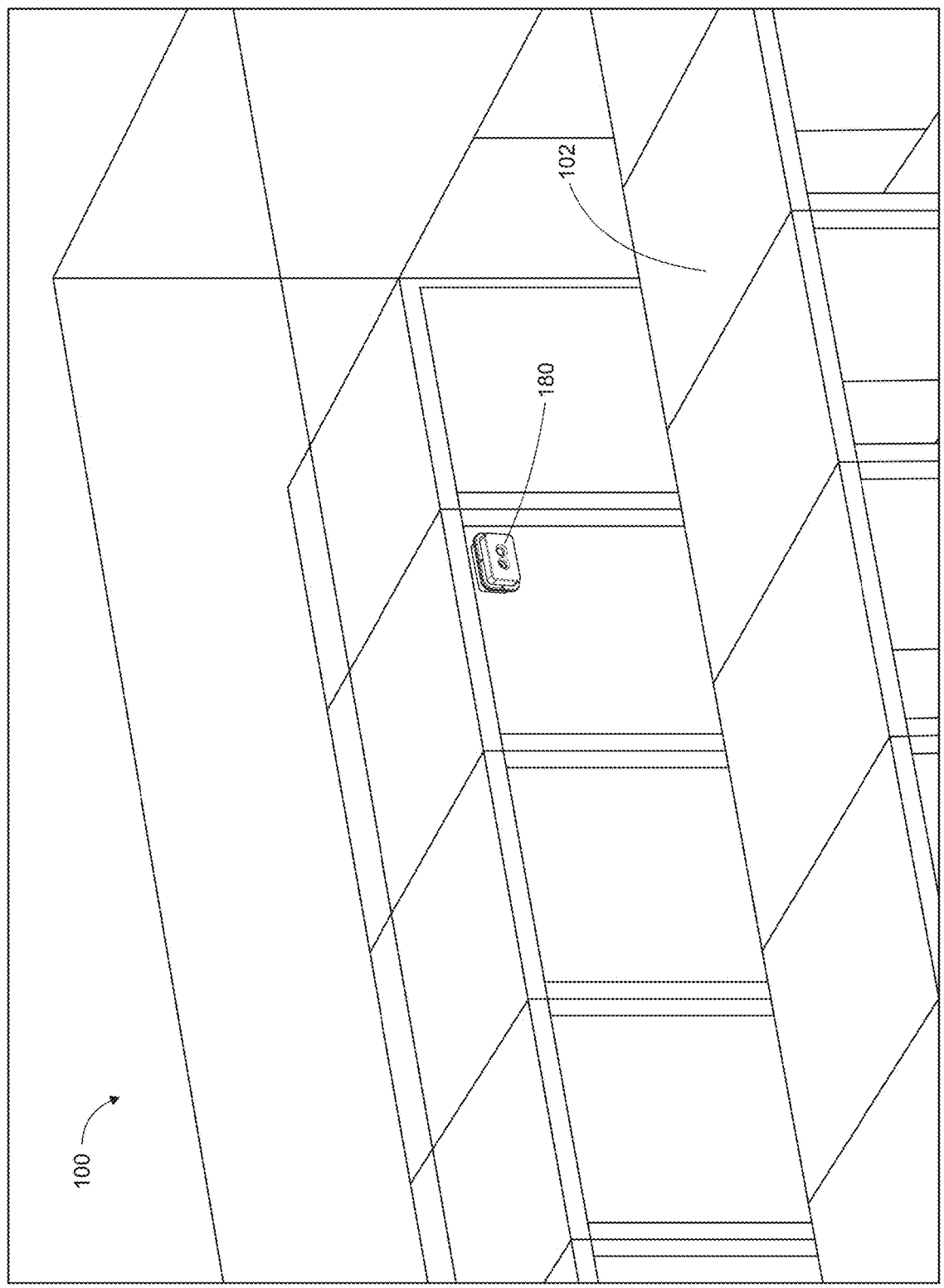
FIG. 8 is an enlarged view of a portion of the embodiment of the offset cooling systems shown in FIG. 7.
Figure 9:
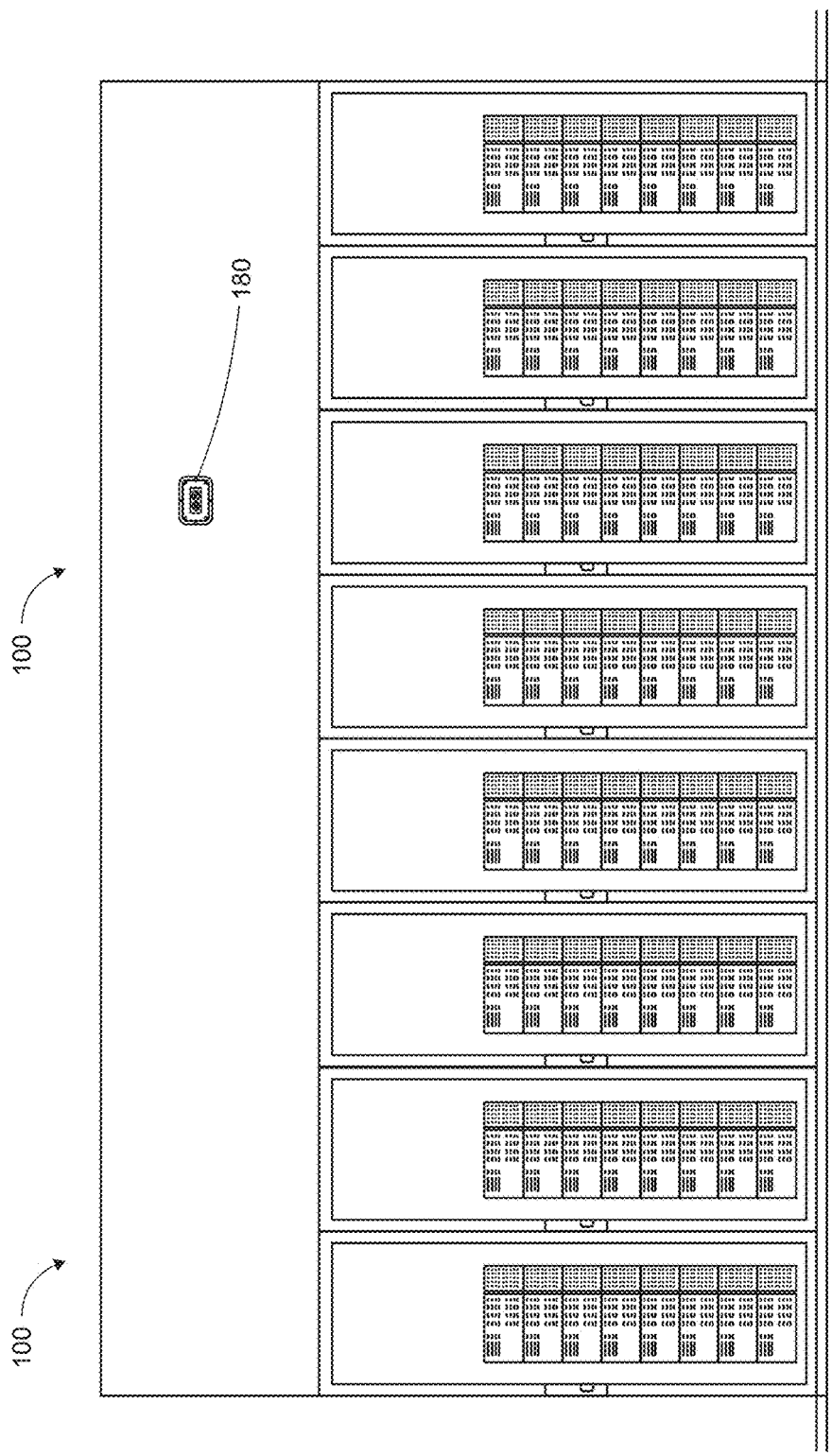
FIG. 9 is another orthogonal view of the embodiment of the offset cooling systems shown in FIG. 7.

In any embodiments disclosed herein, the offset cooling system 100 can have one or more airflow sensors 180 in fluid communication with an airflow through the system. In some embodiments, the one or more sensors 180 can be configured to determine a flow direction of air flowing through the system 100, the differential pressure across the heat exchanger, velocity of the air flowing through the system, and/or temperature of the air flowing through the system 100. FIGS. 7-9 are orthogonal views of an embodiment of the offset cooling system 100, showing an embodiment of the airflow sensor 180 coupled with the system 100. In some embodiments, the sensor 180 can be in fluid communication with the air flowing through the system. For example and without limitation, in some embodiments, the sensor 180 can be supported by the ducting, such as the transition duct 114, of the system 100. In any embodiments disclosed herein, the sensor 180 can provide data to a controller of the system 100 that can be used to control the system 100 and/or one or more components of the system 100.

While certain embodiments of the inventions have been described, these embodiments have been presented by way of example only and are not intended to limit the scope of the disclosure. Indeed, the novel methods and systems described herein may be embodied in a variety of other forms. Furthermore, various omissions, substitutions and changes in the systems and methods described herein may be made without departing from the spirit of the disclosure. The accompanying claims and their equivalents are intended to cover such forms or modifications as would fall within the scope and spirit of the disclosure. Accordingly, the scope of the present inventions is defined only by reference to the appended claims.

Features, materials, characteristics, or groups described in conjunction with a particular aspect, embodiment, or example are to be understood to be applicable to any other aspect, embodiment or example described in this section or elsewhere in this specification unless incompatible therewith. All of the features disclosed in this specification (including any accompanying claims, abstract and drawings), and/or all of the steps of any method or process so disclosed, may be combined in any combination, except combinations where at least some of such features and/or steps are mutually exclusive. The protection is not restricted to the details of any foregoing embodiments. The protection extends to any novel one, or any novel combination, of the features disclosed in this specification (including any accompanying claims, abstract and drawings), or to any novel one, or any novel combination, of the steps of any method or process so disclosed.

Furthermore, certain features that are described in this disclosure in the context of separate implementations can also be implemented in combination in a single implementation. Conversely, various features that are described in the context of a single implementation can also be implemented in multiple implementations separately or in any suitable subcombination. Moreover, although features may be described above as acting in certain combinations, one or more features from a claimed combination can, in some cases, be excised from the combination, and the combination may be claimed as a subcombination or variation of a sub combination.

Moreover, while operations may be depicted in the drawings or described in the specification in a particular order, such operations need not be performed in the particular order shown or in sequential order, or that all operations be performed, to achieve desirable results. Other operations that are not depicted or described can be incorporated in the example methods and processes. For example, one or more additional operations can be performed before, after, simultaneously, or between any of the described operations. Further, the operations may be rearranged or reordered in other implementations. Those skilled in the art will appreciate that in some embodiments, the actual steps taken in the processes illustrated and/or disclosed may differ from those shown in the figures. Depending on the embodiment, certain of the steps described above may be removed, others may be added. Furthermore, the features and attributes of the specific embodiments disclosed above may be combined in different ways to form additional embodiments, all of which fall within the scope of the present disclosure. Also, the separation of various system components in the implementations described above should not be understood as requiring such separation in all implementations, and it should be understood that the described components and systems can generally be integrated together in a single product or packaged into multiple products.

For purposes of this disclosure, certain aspects, advantages, and novel features are described herein. Not necessarily all such advantages may be achieved in accordance with any particular embodiment. Thus, for example, those skilled in the art will recognize that the disclosure may be embodied or carried out in a manner that achieves one advantage or a group of advantages as taught herein without necessarily achieving other advantages as may be taught or suggested herein.

Conditional language, such as "can," "could," "might," or "may," unless specifically stated otherwise, or otherwise understood within the context as used, is generally intended to convey that certain embodiments include, while other embodiments do not include, certain features, elements, and/or steps. Thus, such conditional language is not generally intended to imply that features, elements, and/or steps are in any way required for one or more embodiments or that one or more embodiments necessarily include logic for deciding, with or without user input or prompting, whether these features, elements, and/or steps are included or are to be performed in any particular embodiment.

Conjunctive language such as the phrase "at least one of X, Y, and Z," unless specifically stated otherwise, is otherwise understood with the context as used in general to convey that an item, term, etc. may be either X, Y, or Z. Thus, such conjunctive language is not generally intended to imply that certain embodiments require the presence of at least one of X, at least one of Y, and at least one of Z.

Language of degree used herein, such as the terms "approximately," "about," "generally," and "substantially" as used herein represent a value, amount, or characteristic close to the stated value, amount, or characteristic that still performs a desired function or achieves a desired result. For example, the terms "approximately", "about", "generally," and "substantially" may refer to an amount that is within less than 10% of, within less than 5% of, within less than 1% of, within less than 0.1% of, and within less than 0.01% of the stated amount. As another example, in certain embodiments, the terms "generally parallel" and "substantially parallel" refer to a value, amount, or characteristic that departs from exactly parallel by less than or equal to 15 degrees, 10 degrees, 5 degrees, 3 degrees, 1 degree, or 0.1 degree. The ranges disclosed herein also encompass any and all overlap, sub-ranges, and combinations thereof, and any specific values within those ranges. Language such as "up to," "at least," "greater than," "less than," "between," and the like includes the number recited. Numbers and values used herein preceded by a term such as "about" or "approximately" include the recited numbers. For example, "approximately 7 mm" includes "7 mm" and numbers and ranges preceded by a term such as "about" or "approximately" should be interpreted as disclosing numbers and ranges with or without such a term in front of the number or value such that this application supports claiming the numbers, values and ranges disclosed in the specification and/or claims with or without the term such as "about" or "approximately" before such numbers, values or ranges such, for example, that "approximately two times to approximately five times" also includes the disclosure of the range of "two times to five times."

The scope of the present disclosure is not intended to be limited by the specific disclosures of preferred embodiments in this section or elsewhere in this specification and may be defined by claims as presented in this section or elsewhere in this specification or as presented in the future. The language of the claims is to be interpreted broadly based on the language employed in the claims and not limited to the examples described in the present specification or during the prosecution of the application, which examples are to be construed as non-exclusive.

What is claimed is:

1. An offset cooling system for cooling at least one row of electronics cabinets, comprising:
   a support structure having a lower portion and an upper portion, the lower portion of the support structure being coupled with and configured to support the upper portion of the support structure;
   one or more fans supported by the support structure at a height that is equal to or greater than a height of the electronics cabinets; and
   a heat exchanger having one or more cooling coils supported at the upper portion of the support structure;
   wherein:
      the heat exchanger is supported by the upper portion of the support structure so as to be above a top of one or more of the electronics cabinets; and
      the fans are configured to draw air from the at least one row of electronics cabinets and to cause the air to be passed through the heat exchanger to cool the warmer air from the electronics cabinets.

2. The offset cooling system of claim 1, further comprising a transition duct extending from the lower portion of the support structure to the upper portion of the support structure.

3. The offset cooling system of claim 2, wherein an area of an upper portion of the transition duct is greater than an area of a lower portion of the transition duct, to permit a low static pressure heat exchanger to be used with standard electronics cabinets spacing.

4. The offset cooling system of claim 3, wherein the heat exchanger is supported by the upper portion of the transition duct and/or the upper portion of the support structure.

5. The offset cooling system of claim 3, wherein the transition duct has a first sloping wall and a second sloping wall, the first and second sloping walls extending lengthwise over a portion of the electronics cabinets.

6. The offset cooling system of claim 5, wherein the transition duct has a gutter along a bottom portion of each of the first and second sloping walls that collect any water that collects on the first or second sloping walls of the transition duct.

7. The offset cooling system of claim 2, wherein the transition duct also provides a barrier that covers a top of a portion of the electronics cabinets and that prevents any water that may leak from the heat exchangers from dripping on the electronics cabinets.

8. The offset cooling system of claim 1, wherein the lower portion of the support structure is configured to be positioned in an aisle between the two rows of electronics cabinets.

9. The offset cooling system of claim 1, wherein the at least one row of electronics cabinets comprises a plurality of servers.

10. The offset cooling system of claim 1, wherein the fans are located above an aisle between the two rows of electronics cabinets.

11. The offset cooling system of claim 1, wherein the heat exchanger is positioned above the one or more fans.

12. The offset cooling system of claim 1, wherein the heat exchanger comprises a plurality of cooling coils.

13. The offset cooling system of claim 1, wherein the heat exchanger has a first manifold in fluid communication with a plurality of cooling coils and a second manifold in communication with the plurality of cooling coils.

14. The offset cooling system of claim 1, comprising one or more pressure, velocity, flow direction, and/or temperature sensors configured to control the air flow and temperature of the cooling system.

15. The offset cooling system of claim 1, wherein the IT equipment fans operate in a state of near zero differential air pressure.

16. The offset cooling system of claim 1, wherein the offset cooling system is configured to generally only provide enough fan energy to compensate for static pressure across the heat exchanger and to enable one or more fans within IT equipment of the electronics cabinets to provide a balance of fan energy required to move the air from the at least one row of electronics cabinets through the heat exchanger.

17. A system for a data center, comprising:
a first row of electronics cabinets; and
an offset cooling system for cooling at least the first row of electronics cabinets, the offset cooling system comprising:
a support structure;
one or more fans supported by the support structure; and
a heat exchanger having a plurality of cooling coils supported by the support structure at a height that is above a top of the electronics cabinets of the first row of electronics cabinets;
wherein the fans are configured to draw air from the at least one row of electronics cabinets and to cause the air to be passed through the heat exchanger to cool the warmer air from the electronics cabinets.

18. The system for a data center of claim 17, further comprising a second row of electronics cabinets positioned on an opposite side of an aisle from the first row of electronics cabinets, wherein the heat exchanger extends at least partially over the first and second rows of electronics cabinets.

19. The system for a data center of claim 17, further comprising a transition duct extending from a lower portion of the support structure to an upper portion of the support structure and increases in size such that the upper portion of the support structure is wider than the lower portion of the support structure, and wherein the heat exchanger is supported by the upper portion of the support structure.

20. The offset cooling system of claim 17, wherein an area of an upper portion of the transition duct is greater than an area of a lower portion of the transition duct, to permit a low static pressure heat exchanger to be used with standard electronics cabinets spacing.

21. The system for a data center of claim 17, wherein the offset cooling system is configured to generally only provide enough fan energy to compensate for static pressure across the heat exchanger and to enable one or more fans within IT equipment of the electronics cabinets to provide a balance of fan energy required to move the air from the at least one row of electronics cabinets through the heat exchanger.

22. An offset cooling system for cooling at least one row of electronics cabinets, comprising:
one or more fans supported by a support structure; and
a heat exchanger having one or more cooling coils supported at an upper portion of the support structure and extending over a top of the electronics cabinets, the heat exchanger having a cooling liquid therein such that the cooling liquid passes through the heat exchanger over a portion of the electronics cabinets;
wherein:
the fans are configured to draw air from the at least one row of electronics cabinets and to blow the air through the heat exchanger to cool the warmer air from the electronics cabinets.

* * * * *